United States Patent
Ho et al.

(10) Patent No.: US 6,896,173 B2
(45) Date of Patent: May 24, 2005

(54) METHOD OF FABRICATING CIRCUIT SUBSTRATE

(75) Inventors: Kwun-Yao Ho, Taipei Hsien (TW); Moriss Kung, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 0 days.

(21) Appl. No.: 10/710,561

(22) Filed: Jul. 21, 2004

(65) Prior Publication Data

US 2005/0017058 A1 Jan. 27, 2005

(30) Foreign Application Priority Data

Jul. 21, 2003 (TW) .......... 92119806 A
Sep. 23, 2003 (TW) .......... 92126141 A
Mar. 16, 2004 (TW) .......... 93106926 A

(51) Int. Cl.[7] .......... B23K 31/02
(52) U.S. Cl. .......... 228/215
(58) Field of Search .......... 228/215, 180.1, 228/180.21; 205/50, 125; 428/551, 547; 427/97.7; 430/314, 315, 319; 438/613, 614, 615

(56) References Cited

U.S. PATENT DOCUMENTS

| | | | | |
|---|---|---|---|---|
| 4,581,301 A | * | 4/1986 | Michaelson | 428/551 |
| 4,812,213 A | * | 3/1989 | Barton et al. | 205/50 |
| 5,209,817 A | * | 5/1993 | Ahmad et al. | 216/18 |
| 5,370,766 A | * | 12/1994 | Desaigoudar et al. | 216/13 |
| 6,458,683 B1 | * | 10/2002 | Lee | 438/613 |
| 6,586,276 B2 | * | 7/2003 | Towle et al. | 438/113 |

* cited by examiner

*Primary Examiner*—Jonathan Johnson
(74) *Attorney, Agent, or Firm*—Jiang Chyun IP Office

(57) ABSTRACT

The present invention provides a method of fabricating a circuit substrate. First, a substrate having first pads and second pads is provided, wherein the first pads and second pads are arranged respectively on a first surface and a second surface of the substrate. The first pads are electrically connected to the second pads. Next, a conductive seed layer is formed on the second surface of the circuit substrate. Thereafter, a first conductive layer and a second conductive layer are electroplated respectively over the first pads and the second pads. Afterwards, the conductive seed layer is patterned.

25 Claims, 8 Drawing Sheets

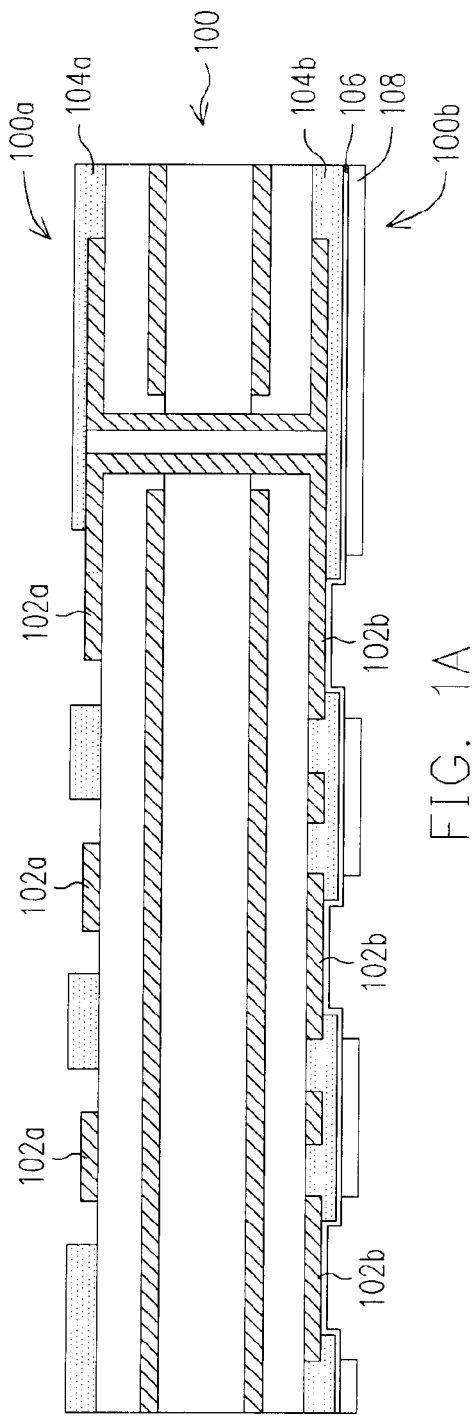
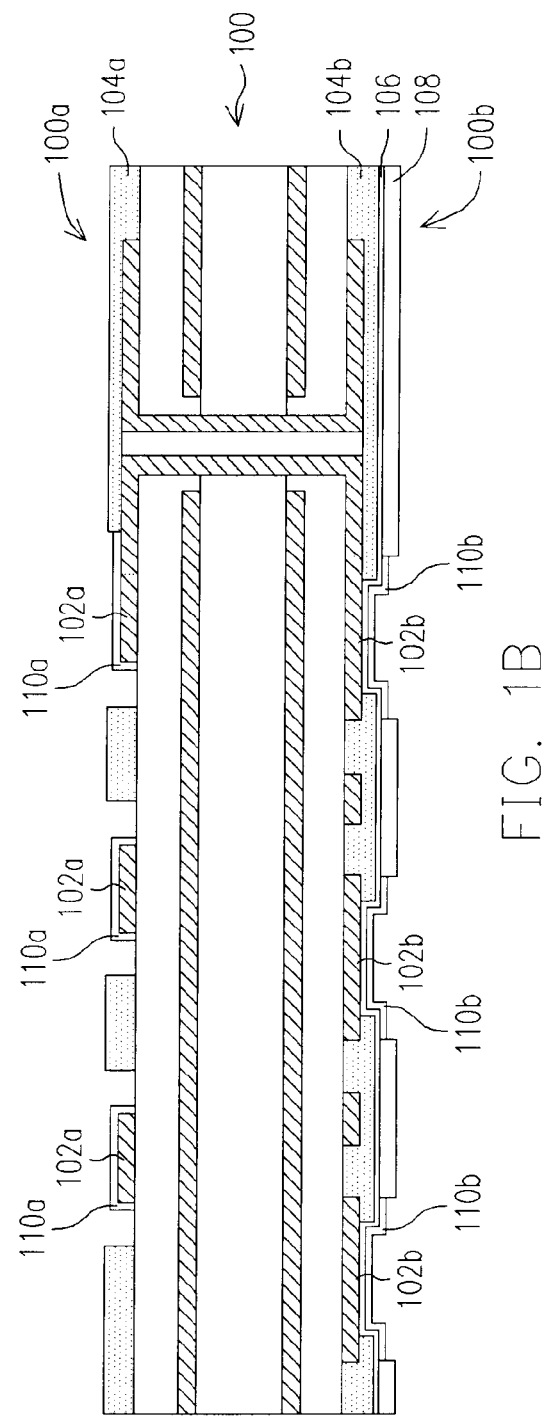
FIG. 1A
FIG. 1B

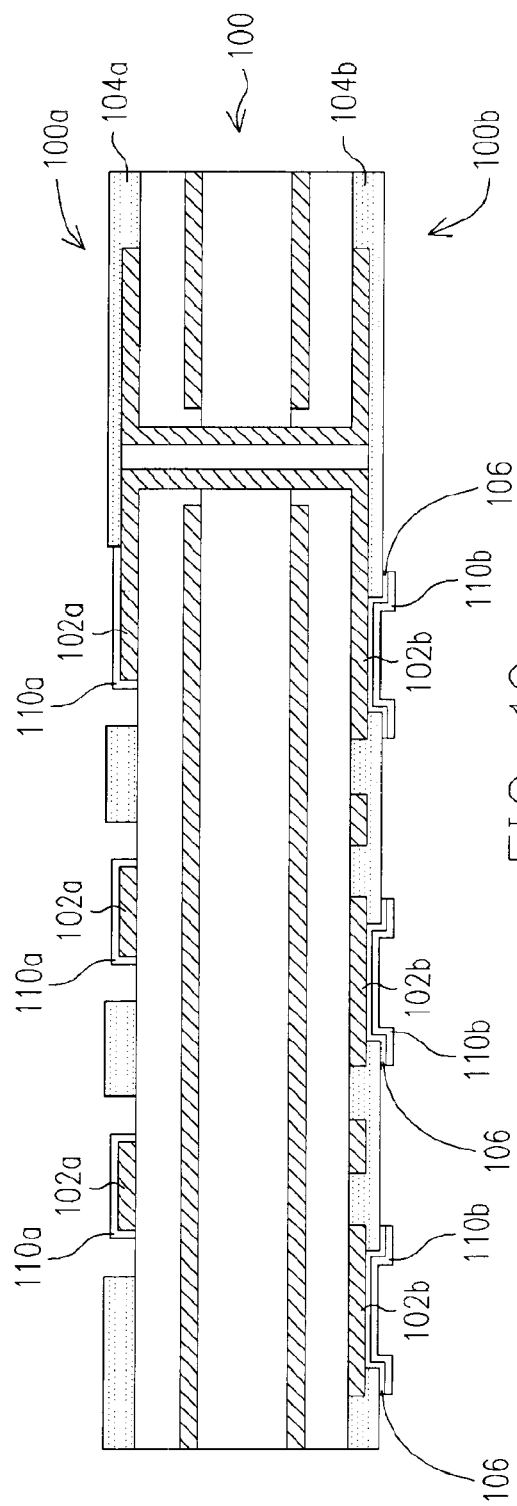
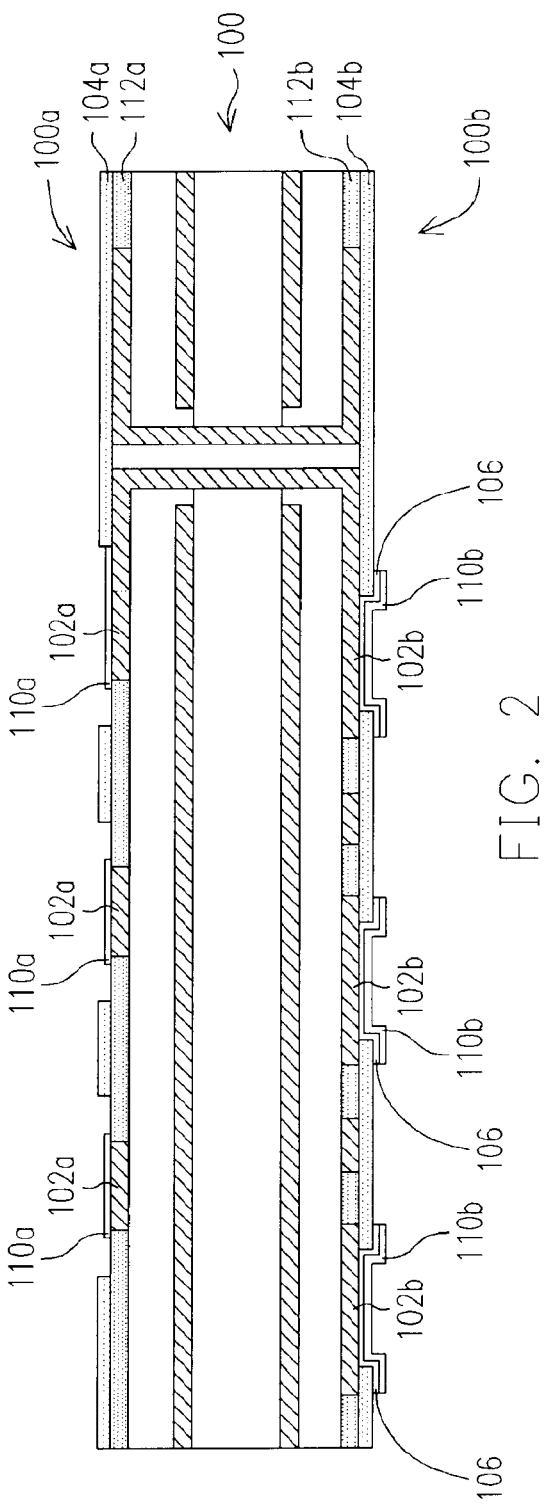
FIG. 1C
FIG. 2

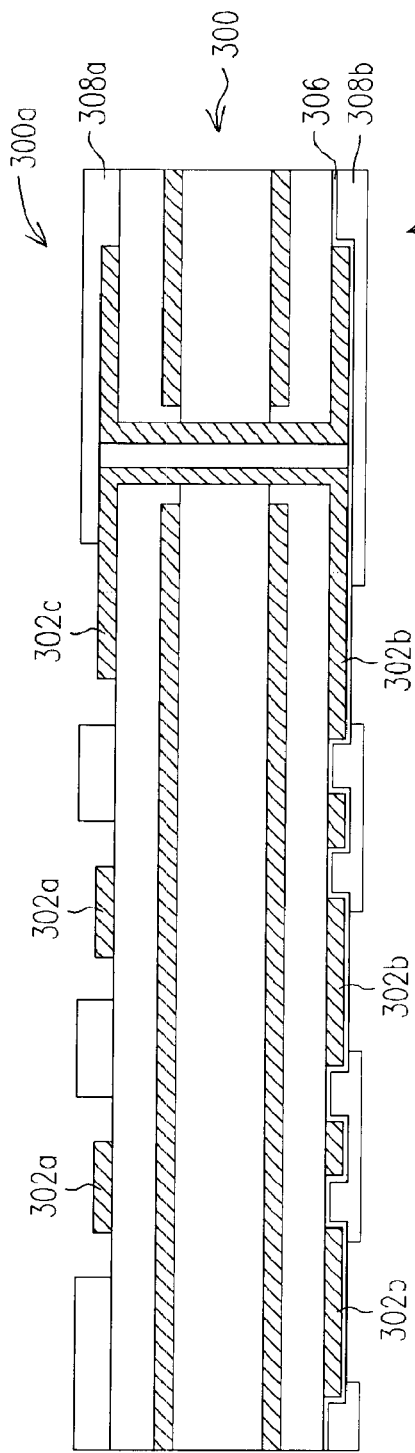
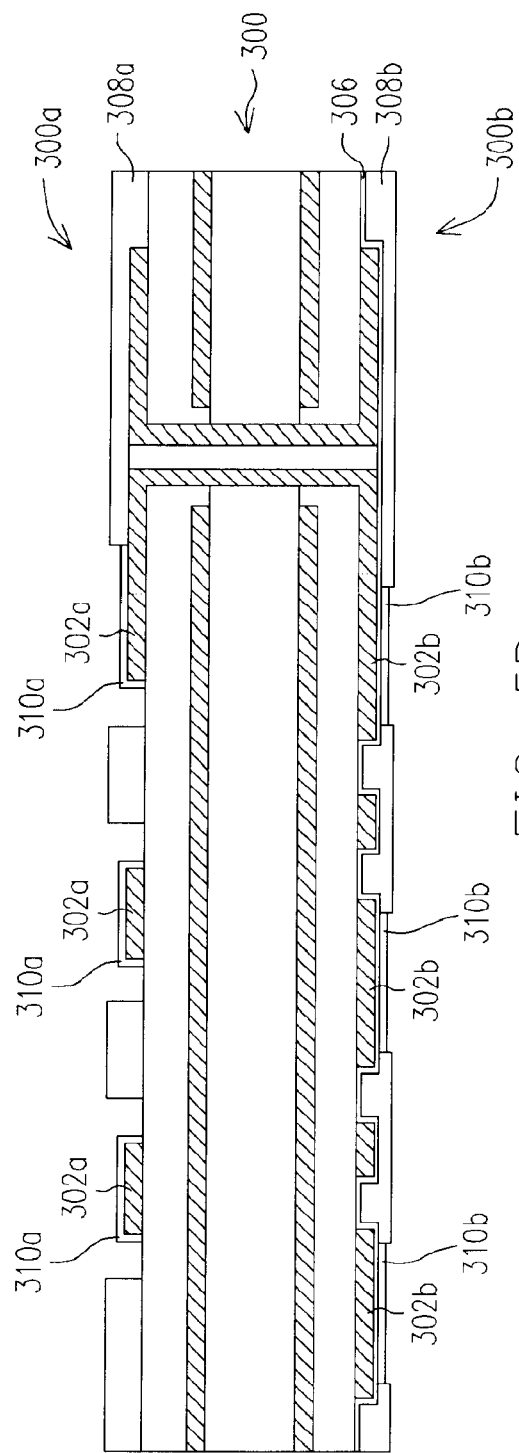

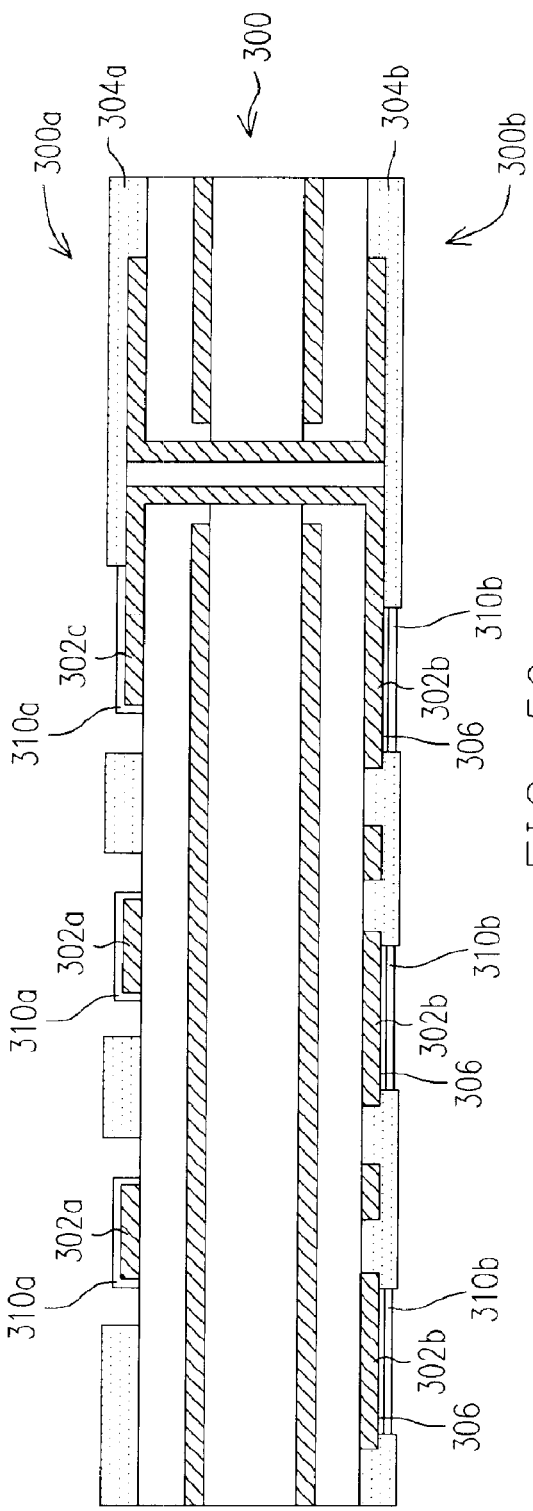
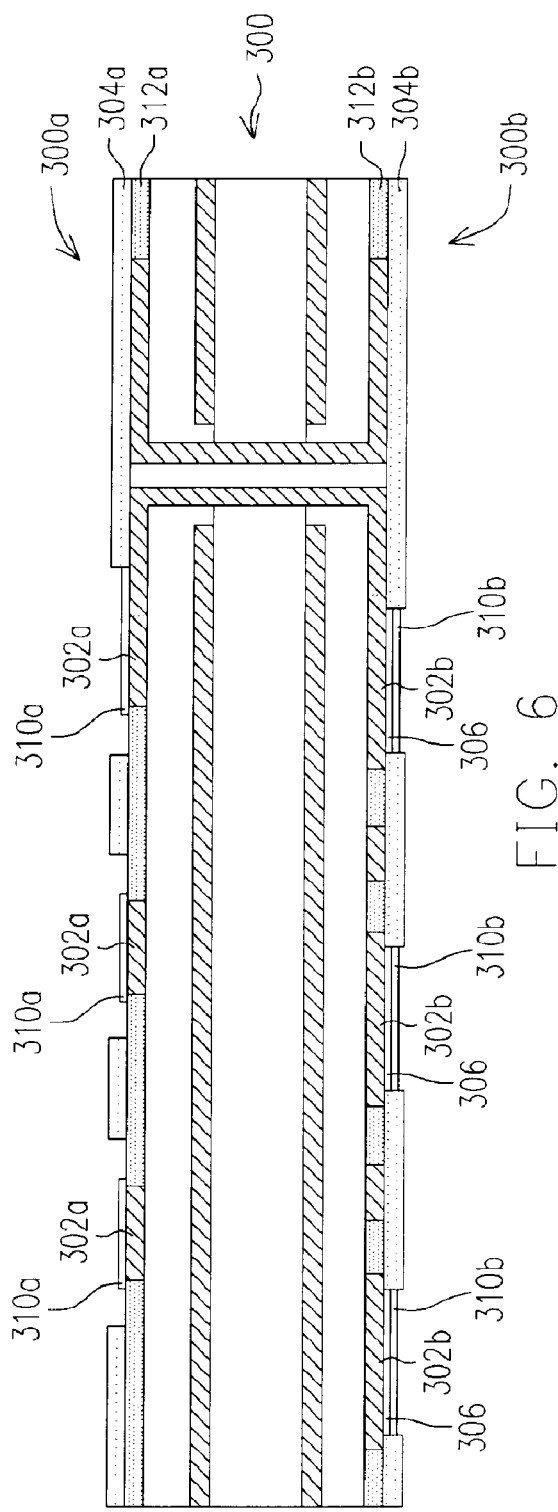

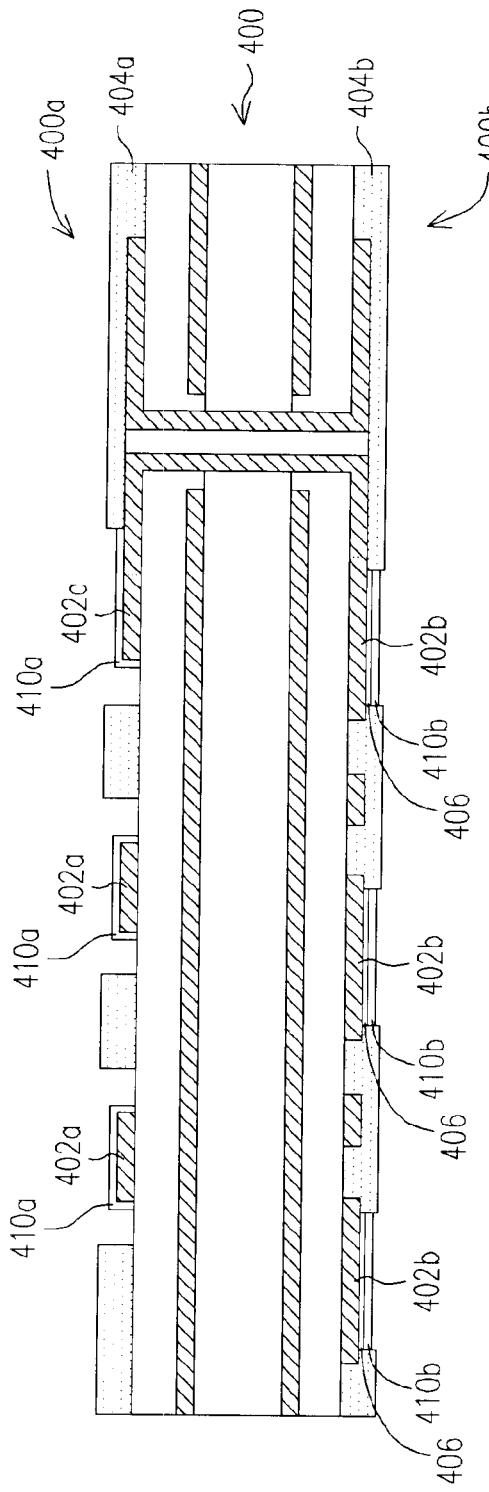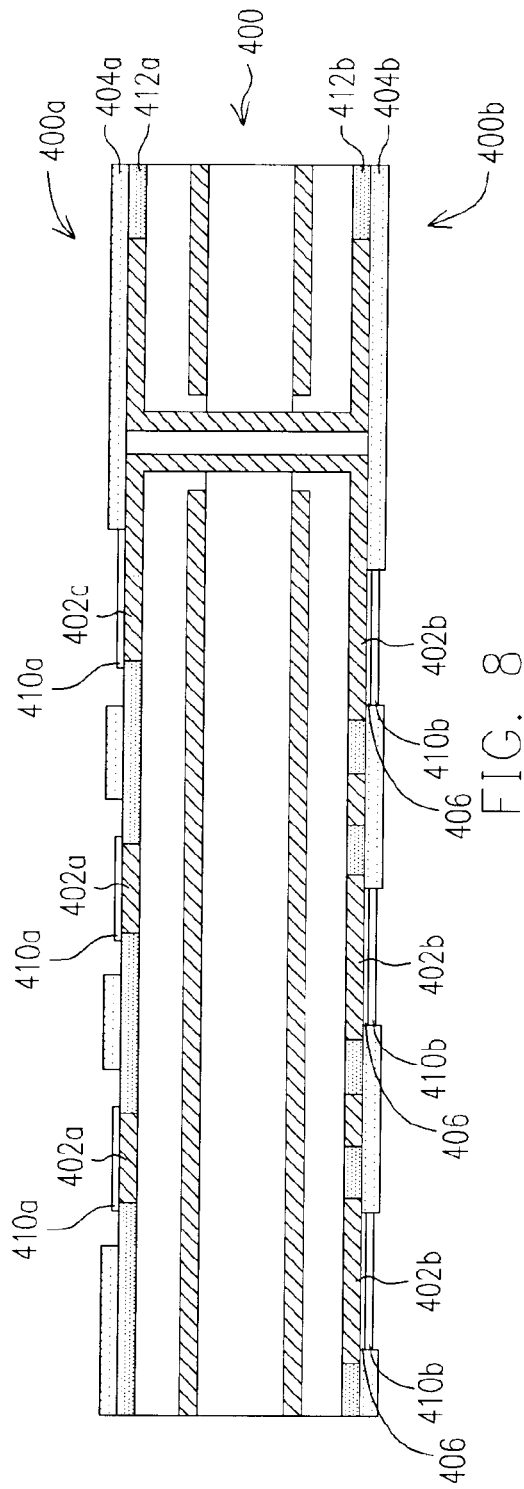

METHOD OF FABRICATING CIRCUIT SUBSTRATE

CROSS REFERENCE TO RELATED APPLICATIONS

This application claims the priority benefit of Taiwan applications serial, no. 92119806, filed Jul. 21, 2003, no. 92126141, filed Sep. 23, 2003, and 93106926, filed Mar. 16, 2004.

BACKGROUND OF INVENTION

1. Field of the Invention

The present invention generally relates to a method of fabricating a circuit substrate. More particularly, the present invention relates to a method of fabricating a circuit substrate with two metal layers simultaneously electroplated on the both sides of the substrate.

2. Description of the Related Art

Printed circuit boards (PCB) that can be bonded with various electric devices are widely utilized in the electronic industry. After the integrated circuit (IC) and the computer system with complex and fine circuitry are presented to the public, the printed circuit boards with a single circuit layer can not provide sufficient layout space and thus the printed circuit boards with double or more circuit layers are successively turned up. Printed circuit boards can serves as a main board of a computer system or as a circuit substrate for packaging chips.

Generally, the printed circuit board comprises multiple patterned circuit layers and at least an insulation layer. The insulation layers are arranged respectively between the neighboring patterned circuit layers. There are multiple vias penetrating through the insulation layers and connecting the patterned circuit layers positioned on the upper and lower sides of the insulation layer. A chip can be electrically connected to a circuit substrate through bumps or conductive wires, and further, can be electrically connected to external devices through the internal circuitry of the substrate and the contacts, such as solder balls or pins, positioned on the lower surface of the substrate.

As far as a wire-bonding and ball-grid-array type of chip package is concerned, the chip package includes a circuit substrate having multiple pads formed on the upper surface thereof for jointing with conductive wires and formed on the lower surface thereof for jointing with solder balls. It should be noted that the circuit layer is generally made of copper. In order to avoid oxidation of the pads made of copper and to enhance the reliability and yield of connecting conductive wires onto the pads, metal layers, such as Ni/Au layers, are generally electroplated on the copper layer.

For electroplating metal layers on the pads, plating lines are formed on the peripheral areas of the circuit substrate. The metal layers are electroplated on the pads by providing an electrical current flowing through the plating lines. In the above technology, only if the plating lines are arranged on the circuit substrate, the electroplating processes can be conducted. However, the plating lines occupy the layout area of the circuit substrate and thereby the circuit substrate has lower layout density. Moreover, after the electroplating processes, the plating lines should be cut. Even though the plating lines have been cut, the plating lines can not be completely eliminated and stubs still remains on the circuit substrate. When electric current flows through the circuit line jointed with the stubs, noise will be dramatically generated and thereby the circuit has a lower electric effect.

In order to solve the above problem, a method of electroplating metal layers on both sides of the circuit substrate is being developed without the plating lines. In this method, two conductive seed layers are formed respectively on both sides of the circuit substrate. Two patterned photoresist layers are formed respectively on the conductive seed layers positioned on both sides of the circuit substrate and have openings exposing the conductive metal layers. An electrical current is applied to flow through the conductive seed layers to electroplate metal layers on the conductive seed layers positioned on both sides of the circuit substrate. The metal layers are formed on the surface of the exposed conductive seed layers. The above mentioned electroplating process is inefficient and time-consuming.

In order to solve the above problem, chemical-plating processes have been proposed for plating the metal layers. However, the metal layer plated using such chemical plating processes is very thin and has unstable electrical properties.

SUMMARY OF INVENTION

Accordingly, in an embodiment of the present invention, a method of fabricating a circuit substrate is provided with two metal layers simultaneously electroplated on the both sides of the substrate using only one conductive seed layer.

To achieve these and other advantages and in accordance with the purpose of the invention, as embodied and broadly described herein, the present invention provides a method of fabricating a circuit substrate. First, a substrate having first pads and second pads is provided, wherein the first pads and second pads are arranged respectively on a first surface and a second surface of the substrate. The first pads are electrically connected to the second pads. Next, a conductive seed layer is formed on the second surface of the circuit substrate. Thereafter, a first conductive layer and a second conductive layer are electroplated respectively over the first pads and the second pads. Afterwards, the conductive seed layer is patterned.

Based on the above mentioned, the conductive seed layer is formed on the second surface of the circuit substrate. The first conductive layer is electroplated over the first pads with applying an electric current flowing through the conductive seed layer and the internal circuitry connecting the first pads and the second pads. The second conductive layer is electroplated over the second pads with applying an electric current flowing through the conductive seed layer. Moreover, a patterned mask layer can be provided to define the pattern of the second conductive layer electroplated over the conductive seed layer. A patterned solder mask layer can be provided to define the exposed area of the second conductive layer electroplated over the conductive seed layer.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 1A to 1C are schematic cross-sectional views showing a method for fabricating a circuit substrate according to a first preferred embodiment of the present invention.

FIG. 2 is a schematic cross-sectional view showing a circuit substrate according to a first preferred embodiment of the present invention, wherein there is an insulation layer positioned between adjacent traces of a surface circuit layer and there is a solder mask layer positioned on the insulation layer.

FIGS. 5A to 5C are schematic cross-sectional views showing a method for fabricating a circuit substrate according to a third preferred embodiment of the present invention.

FIG. 6 is a schematic cross-sectional view showing a circuit substrate according to a third preferred embodiment of the present invention, wherein there is an insulation layer positioned between adjacent traces of a surface circuit layer and there is a solder mask layer positioned on the insulation layer.

FIGS. 7A to 7C are schematic cross-sectional views showing a method for fabricating a circuit substrate according to a fourth preferred embodiment of the present invention.

FIG. 8 is a schematic cross-sectional view showing a circuit substrate according to a fourth preferred embodiment of the present invention, wherein there is an insulation layer positioned between adjacent traces of a surface circuit layer and there is a solder mask layer positioned on the insulation layer.

DETAILED DESCRIPTION

Figure 3A:
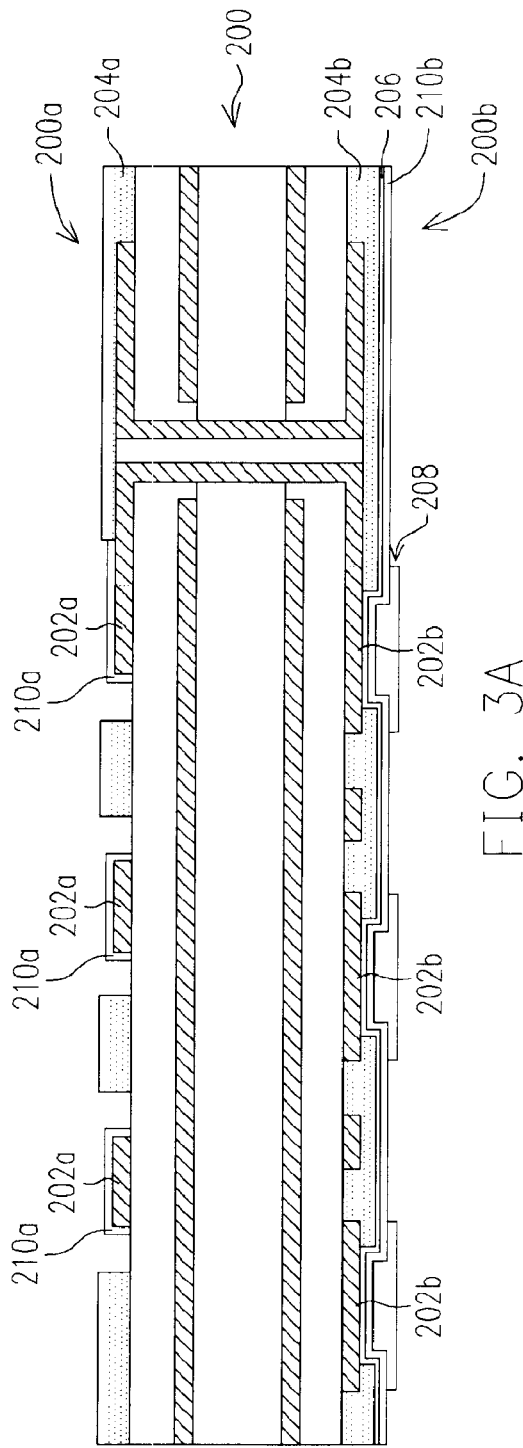
FIGS. 3A to 3C are schematic cross-sectional views showing a method for fabricating a circuit substrate according to a second preferred embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

First Embodiment

FIGS. 1A to 1C are schematic cross-sectional views showing a method for fabricating a circuit substrate according to a first preferred embodiment of the present invention.

As shown in FIG. 1A, a circuit substrate 100 having multiple patterned circuit layers and at least an insulation layer is provided. The insulation layer is arranged between the adjacent patterned circuit layers. There are multiple vias penetrating through the insulation layer and connecting the adjacent patterned circuit layers. These patterned circuit layers and the vias compose an internal circuitry of the circuit substrate 100.

The circuit substrate 100 has multiple first pads 102a and multiple second pads 102b arranged respectively on a first surface 100a and a second surface 100b of the circuit substrate 100. The first pads 102a and the second pads 102b are provided by the outmost circuit layers at both sides of the circuit substrate 100. The circuit substrate 100 has a first patterned solder mask layer 104a formed on the first surface 100a of the circuit substrate 100. The first solder mask layer 104a has openings exposing the first pads 102a in a solder-mask-define type (SMD) or in a non-solder-mask-define type (NSMD). For example, the openings of the first solder mask layer 104a expose the first pads 102a in a non-solder-mask-define type (NSMD) herein. The circuit substrate 100 has a second patterned solder mask layer 104b formed on the second surface 100b of the circuit substrate 100. The second solder mask layer 104b has openings exposing the second pads 102b in a solder-mask-define type (SMD) or in a non-solder-mask-define type (NSMD). For example, The openings of the second solder mask layer 104b expose the second pads 102b in a solder-mask-define type (SMD) herein.

As shown in FIG. 1A, after the circuit substrate 100 is provided, a conductive seed layer 106 is formed on the entire second surface 100b of the circuit layer 100 and covers the second pads 102b exposed by the openings of the second solder mask layer 104b.

As shown in FIG. 1A, after the conductive seed layer 106 is formed, a patterned mask layer 108 is formed on the second surface 100b of the circuit substrate 100. The mask layer 108 has multiple openings exposing the conductive seed layer 106 positioned on the second pads 102b.

As shown in FIG. 1B, after the mask layer 108 is formed, a first conductive layer 110a is electroplated over the first pads 102a with applying an electric current flowing through the conductive seed layer 106 and the internal circuitry of the circuit substrate 100; meanwhile, a second conductive layer 110b is electroplated over the second pads 102b with applying an electric current flowing through the conductive seed layer 106. The first conductive layer 110a and the second conductive layer 110b may be a single metal layer or multiple metal layers, such as Ni/Au layers.

As shown in FIG. 1C, after the first conductive layer 110a and the second conductive layer 110b are formed, the mask layer 108 shown in FIG. 1B is eliminated and then the conductive seed layer 106 is patterned by removing the exposed conductive seed layer 106 using an etching method or a polishing method, for example. The second solder mask layer 104b not covered by the second conductive layer 110b is exposed.

FIG. 2 is a schematic cross-sectional view showing a circuit substrate according to a first preferred embodiment of the present invention, wherein there is an insulation layer positioned between adjacent traces of a surface circuit layer and there is a solder mask layer positioned on the insulation layer. As shown in FIG. 2, the circuit substrate 100 further comprises a first insulation layer 112a formed on the first surface 100a of the circuit substrate 100 and adjacent to the first pads 102a. The first insulation layer 112a has an upper surface coplanar with that of the first pads 102a. The first solder mask layer 104a is formed on the first insulation layer 112a. The circuit substrate 100 further comprises a second insulation layer 112b formed on the second surface 100b of the circuit substrate 100 and adjacent to the second pads 102b. The second insulation layer 112b has a lower surface coplanar with that of the second pads 102b. The second solder mask layer 104b is formed on the second insulation layer 112b.

Based on the first embodiment, after forming a conductive seed layer and a patterned mask layer in sequence, a conductive layer is electroplated over multiple pads on a side of a circuit substrate; at the same time, another conductive layer is electroplated over multiple pads on the other side of the circuit substrate. Thereafter, the mask layer is eliminated. As above mentioned, the conductive layers can be simultaneously formed on the both sides of the circuit substrate with forming only one conductive seed layer and only one patterned mask layer.

Second Embodiment

In the first embodiment, forming a conductive seed layer, a patterned mask layer and a conductive layer in sequence is provided. In the second embodiment, forming a conductive seed layer, a conductive layer and a patterned mask layer in sequence is provided.

Figure 3B:
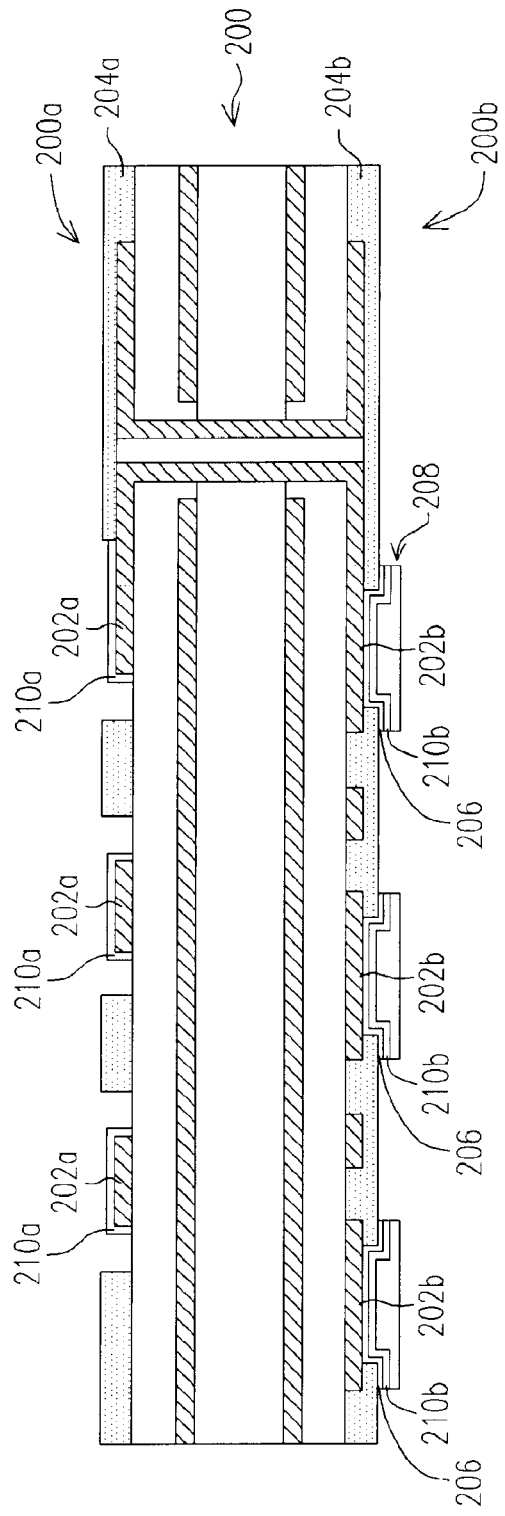
Figure 3C:
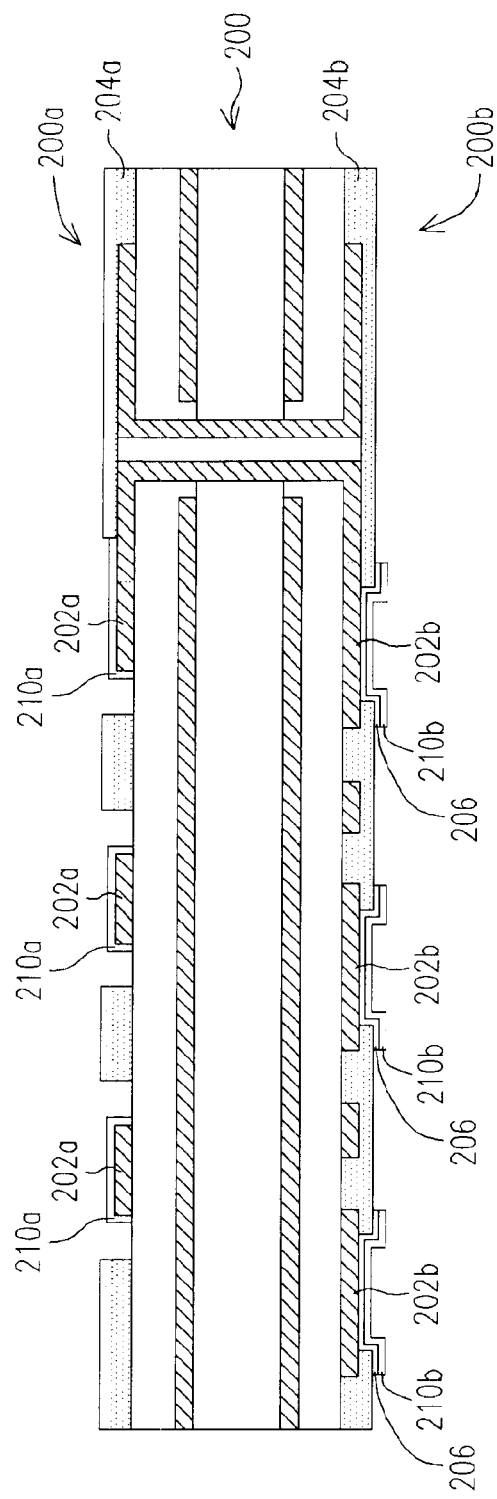

FIGS. 3A to 3C are schematic cross-sectional views showing a method for fabricating a circuit substrate according to a second preferred embodiment of the present invention.

As shown in FIG. 3A, a circuit substrate 200 having a structure similar with the circuit substrate 100 disclosed in the first embodiment is provided. The details about the structure of the circuit substrate 200 are omitted. The circuit substrate 200 has multiple first pads 202a and multiple second pads 202b arranged respectively on a first surface 200a and a second surface 200b of the circuit substrate 200. The first pads 202a and the second pads 202b are provided by the outmost circuit layers at both sides of the circuit substrate 200. The circuit substrate 200 has a first patterned solder mask layer 204a formed on the first surface 200a of the circuit substrate 200. The first solder mask layer 204a has openings exposing the first pads 202a in a solder-mask-define type (SMD) or in a non-solder-mask-define type (NSMD). For example, the openings of the first solder mask layer 204a expose the first pads 202a in a non-solder-mask-define type (NSMD) herein. The circuit substrate 200 has a second patterned solder mask layer 204b formed on the second surface 200b of the circuit substrate 200. The second solder mask layer 204b has openings exposing the second pads 202b in a solder-mask-define type (SMD) or in a non-solder-mask-define type (NSMD). For example, The openings of the second solder mask layer 204b expose the second pads 202b in a solder-mask-define type (SMD) herein.

As shown in FIG. 3A, after the circuit substrate 200 is provided, a conductive seed layer 206 is formed on the entire second surface 200b of the circuit layer 200 and covers the second pads 202b exposed by the openings of the second solder mask layer 204b.

As shown in FIG. 3A, after the conductive seed layer 206 is formed, a first conductive layer 210a is electroplated over the first pads 202a with applying an electric current flowing through the conductive seed layer 206, and the internal circuitry of the circuit substrate 200; meanwhile, a second conductive layer 210b is electroplated on the entire conductive seed layer 206 with applying an electric current flowing through the conductive seed layer 206. The first conductive layer 210a and the second conductive layer 210b may be a single metal layer or multiple metal layers, such as Ni/Au layers.

As shown in FIG. 3A, after the first conductive layer 210a and the second conductive layer 210b are formed, a patterned mask layer 208 is formed on the second conductive layer 210b. The mask layer 208 covers the second conductive layer 210b positioned over the second pads 202b.

As shown in FIG. 3B, after the conductive seed layer 206, the second conductive layer 210b and the mask layer 208 are formed in sequence, the second conductive layer 210b is patterned by removing the exposed second conductive layer 210b using an etching method, for example. Thereafter, the conductive seed layer 206 is patterned by removing the exposed conductive seed layer 206 using an etching method or a polishing method, for example.

As shown in FIG. 3C, after the second conductive layer 210b and the conductive seed layer 206 are patterned, the mask layer 208 shown in FIG. 3B is eliminated and a surface of the patterned second conductive layer 210b is exposed.

Figure 4:
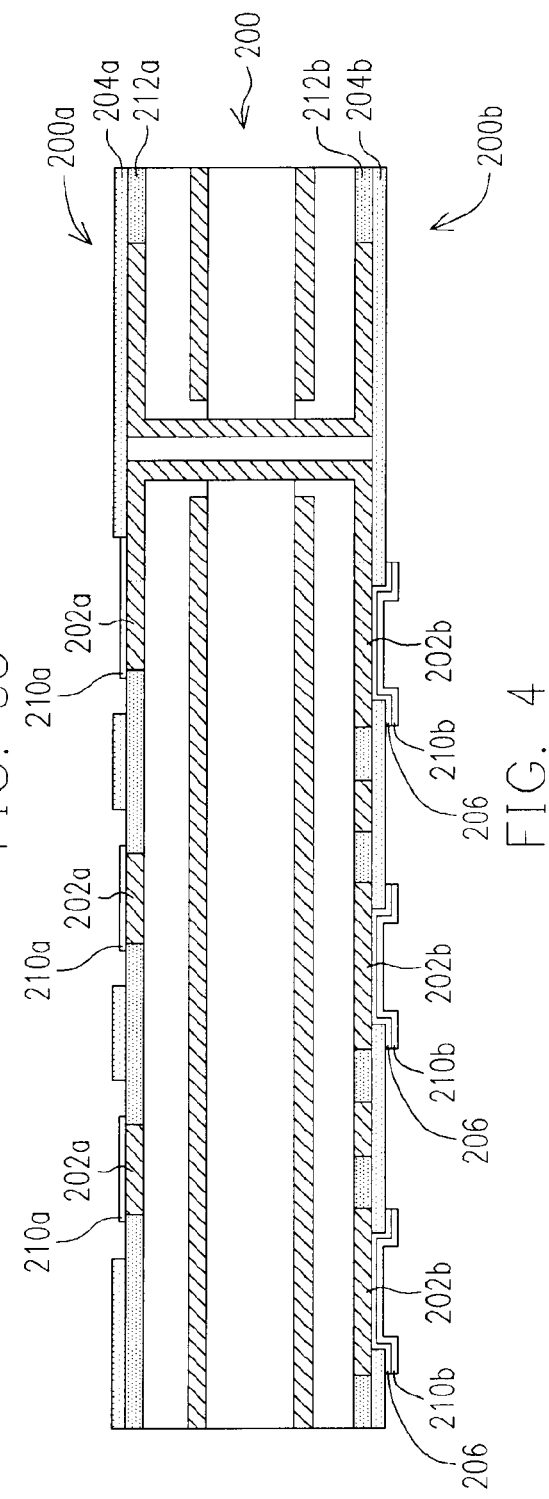
FIG. 4 is a schematic cross-sectional view showing a circuit substrate according to a second preferred embodiment of the present invention, wherein there is an insulation layer positioned between adjacent traces of a surface circuit layer and there is a solder mask layer positioned on the insulation layer.

FIG. 4 is a schematic cross-sectional view showing a circuit substrate according to a second preferred embodiment of the present invention, wherein there is an insulation layer positioned between adjacent traces of a surface circuit layer and there is a solder mask layer positioned on the insulation layer. As shown in FIG. 4, the circuit substrate 200 further comprises a first insulation layer 212a and a second insulation layer 212b. The arrangement of the first insulation layer 212a and the second insulation layer 212b is similar with that of the first insulation layer 112a and the second insulation layer 112b in the first embodiment. The details about the arrangement of the first insulation layer 212a and the second insulation layer 212b are omitted.

Based on the second embodiment, after forming a conductive seed layer, a conductive layer is electroplated over multiple pads on a side of a circuit substrate; at the same time, another conductive layer is electroplated over the entire conductive seed layer on the other side of the circuit substrate. Thereafter, the conductive seed layer and the conductive layer formed thereon are patterned by forming a patterned mask layer on the conductive layer positioned on the conductive seed layer. As above mentioned, the conductive layers can be simultaneously formed on the both sides of the circuit substrate with forming only one conductive seed layer. The conductive seed layer and the conductive layer formed thereon can be patterned by forming only one patterned mask layer over the unpatterned conductive layer and the unpatterned conductive seed layer.

Third Embodiment

In the first and second embodiments, two solder mask layers are formed on both sides of the circuit substrate prior to forming a conductive seed layer on a side of the circuit substrate and forming two conductive layers on both sides of the circuit substrate. In the second embodiment, two solder mask layers are formed on both sides of the circuit substrate after forming a conductive seed layer on a side of the circuit substrate and forming two conductive layers on both sides of the circuit substrate.

FIGS. 5A to 5C are schematic cross-sectional views showing a method for fabricating a circuit substrate according to a third preferred embodiment of the present invention.

As shown in FIG. 5A, a circuit substrate 300 having a structure similar with the circuit substrate 100 disclosed in the first embodiment is provided. The details about the structure of the circuit substrate 300 are omitted. The circuit substrate 300 has multiple first pads 302a and multiple second pads 302b arranged respectively on a first surface 300a and a second surface 300b of the circuit substrate 300. The first pads 302a and the second pads 302b are provided by the outmost circuit layers at both sides of the circuit substrate 300.

As shown in FIG. 5A, after the circuit substrate 300 is provided, a conductive seed layer 306 is formed on the entire second surface 300b of the circuit layer 300 and covers the second pads 302b and the traces of the outmost circuit layer.

As shown in FIG. 5A, after the conductive seed layer 306 is formed, a first patterned mask layer 308a is formed on the first surface 300a of the circuit substrate 300. The first mask layer 308a has multiple openings exposing the first pads 302a. A second patterned mask layer 308b is formed on the second surface 300b of the circuit substrate 300. The second mask layer 308b has multiple openings exposing the conductive seed layer 306 positioned on the second pads 302b.

As shown in FIG. 5B, after the first mask layer 308a and the second mask layer 308b are formed, a first conductive layer 310a is electroplated over the first pads 302a with applying an electric current flowing through the conductive seed layer 306 and the internal circuitry of the circuit substrate 300; meanwhile, a second conductive layer 310b is electroplated over the second pads 302b with applying an electric current flowing through the conductive seed layer 306. The first conductive layer 310a and the second conductive layer 310b may be a single metal layer or multiple metal layers, such as Ni/Au layers.

As shown in FIG. 5C, after the first conductive layer 310a and the second conductive layer 310b are formed, the first mask layer 308a and the second mask layer 308b shown in FIG. 5B are eliminated and then the conductive seed layer 306 is patterned by removing the exposed conductive seed layer 306 using an etching method or a polishing method, for example.

As shown in FIG. 5C, after the conductive seed layer 306 is patterned, a first patterned solder mask layer 304a is optionally on the first surface 300a of the circuit substrate 300. The first solder mask layer 304a has openings exposing all or part of the first conductive layer 310a. A second patterned solder mask layer 304b is optionally on the second surface 300b of the circuit substrate 300. The second solder mask layer 304b has openings exposing all or part of the second conductive layer 310b.

FIG. 6 is a schematic cross-sectional view showing a circuit substrate according to a third preferred embodiment of the present invention, wherein there is an insulation layer positioned between adjacent traces of a surface circuit layer and there is a solder mask layer positioned on the insulation layer. As shown in FIG. 6, the circuit substrate 300 further comprises a first insulation layer 312a and a second insulation layer 312b. The arrangement of the first insulation layer 312a and the second insulation layer 312b is similar with that of the first insulation layer 112a and the second insulation layer 112b in the first embodiment. The details about the arrangement of the first insulation layer 312a and the second insulation layer 312b are omitted.

Based on the third embodiment, after forming a conductive seed layer and two patterned mask layers in sequence, a conductive layer is electroplated over multiple pads on a side of a circuit substrate; at the same time, another conductive layer is electroplated over multiple pads on the other side of the circuit substrate. Next, the mask layers are eliminated and then the conductive seed layer is patterned. Thereafter, two patterned solder mask layers are formed respectively on both sides of the circuit substrate. The patterned solder mask layers have openings exposing all or part of the conductive layers. As above mentioned, the conductive layers can be simultaneously formed on the both sides of the circuit substrate with forming only one conductive seed layer.

Fourth Embodiment

In the third embodiment, forming a conductive seed layer, a patterned mask layer and a conductive layer in sequence is provided. In the fourth embodiment, forming a conductive seed layer, a conductive layer and a patterned mask layer in sequence is provided.

Figure 7A:
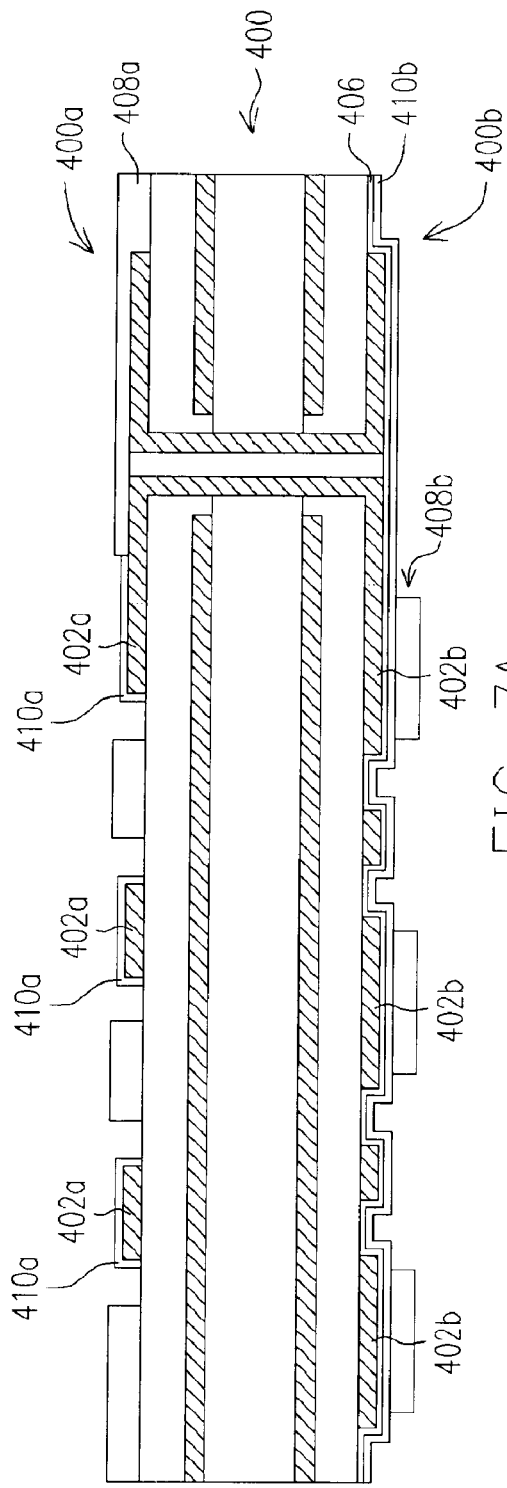
Figure 7B:
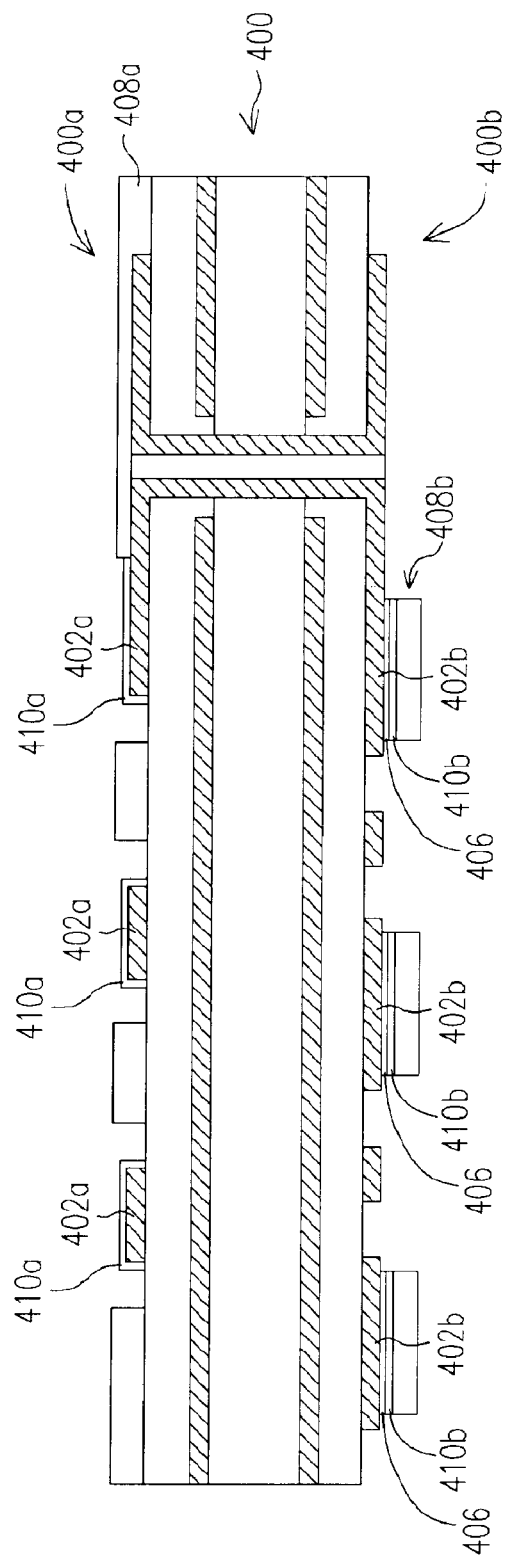

FIGS. 7A to 7C are schematic cross-sectional views showing a method for fabricating a circuit substrate according to a fourth preferred embodiment of the present invention.

As shown in FIG. 7A, a circuit substrate 400 having a structure similar with the circuit substrate 100 disclosed in the first embodiment is provided. The details about the structure of the circuit substrate 400 are omitted. The circuit substrate 400 has multiple first pads 402a and multiple second pads 402b arranged respectively on a first surface 400a and a second surface 400b of the circuit substrate 400. The first pads 402a and the second pads 402b are provided by the outmost circuit layers at both sides of the circuit substrate 400.

As shown in FIG. 7A, after the circuit substrate 400 is provided, a conductive seed layer 406 is formed on the entire second surface 400b of the circuit layer 400 and covers the second pads 402b and the traces of the outmost circuit layer.

As shown in FIG. 7A, after the conductive seed layer 406 is formed, a first patterned mask layer 408a is formed on the first surface 400a of the circuit substrate 400. The first mask layer 408a has multiple openings exposing the first pads 402a.

As shown in FIG. 7A, after the first mask layer 408a is formed, a first conductive layer 410a is electroplated over the first pads 402a with applying an electric current flowing through the conductive seed layer 406, and the internal circuitry of the circuit substrate 400; meanwhile, a second conductive layer 410b is electroplated on the entire conductive seed layer 406 with applying an electric current flowing through the conductive seed layer 406. The first conductive layer 410a and the second conductive layer 410b may be a single metal layer or multiple metal layers, such as Ni/Au layers.

As shown in FIG. 7A, after the first conductive layer 410a and the second conductive layer 410b are formed, a second patterned mask layer 408b is formed on the second conductive layer 410b. The second mask layer 408b covers the second conductive layer 410b positioned over the second pads 402b.

As shown in FIG. 7B, after the conductive seed layer 406, the second conductive layer 410b and the mask layer 408 are formed in sequence, the second conductive layer 410b is patterned by removing the exposed second conductive layer 410b using an etching method, for example. Thereafter, the conductive seed layer 406 is patterned by removing the exposed conductive seed layer 406 using an etching method or a polishing method, for example.

As shown in FIG. 7C, after the second conductive layer 410b and the conductive seed layer 406 are patterned, the first mask layer 408a and the second mask layer 408b shown in FIG. 7B are eliminated. Alternatively, the first mask layer 408a may be eliminated in other steps on condition that the first conductive layer 410a is formed.

As shown in FIG. 7C, after the first mask layer 408a and the second mask layer 408b are eliminated, a first patterned solder mask layer 404a is optionally on the first surface 400a of the circuit substrate 400. The first solder mask layer 404a has openings exposing all or part of the first conductive layer 410a. A second patterned solder mask layer 404b is optionally on the second surface 400b of the circuit substrate 400. The second solder mask layer 404b has openings exposing all or part of the second conductive layer 410b positioned over the second pads 402b.

FIG. 8 is a schematic cross-sectional view showing a circuit substrate according to a fourth preferred embodiment of the present invention, wherein there is an insulation layer positioned between adjacent traces of a surface circuit layer and there is a solder mask layer positioned on the insulation layer. As shown in FIG. 8, the circuit substrate 400 further comprises a first insulation layer 412a and a second insulation layer 412b. The arrangement of the first insulation layer 412a and the second insulation layer 412b is similar with that of the first insulation layer 112a and the second insulation layer 112b in the first embodiment. The details about the arrangement of the first insulation layer 412a and the second insulation layer 412b are omitted.

Based on the fourth embodiment, after forming a conductive seed layer on a lower side of a circuit substrate and forming a mask layer on an upper side of the circuit substrate, a conductive layer is electroplated over multiple pads on the upper side of the circuit substrate; at the same time, another conductive layer is electroplated over the entire conductive seed layer on the lower side of the circuit substrate. Next, the mask layer is eliminated, and the conductive seed layer and the conductive layer thereon are patterned. Thereafter, two patterned solder mask layers are formed respectively on both sides of the circuit substrate. The patterned solder mask layers have openings exposing all or part of the conductive layers. As above mentioned, the conductive layers can be simultaneously formed on the both sides of the circuit substrate with forming only one conductive seed layer.

Conclusion

Based on the above mentioned, the conductive seed layer is formed on the second surface of the circuit substrate. The first conductive layer is electroplated over the first pads with applying an electric current flowing through the conductive seed layer and the internal circuitry connecting the first pads and the second pads. The second conductive layer is electroplated over the second pads with applying an electric current flowing through the conductive seed layer. Moreover, a patterned mask layer can be provided to define the pattern of the second conductive layer electroplated over the conductive seed layer. A patterned solder mask layer can be provided to define the exposed area of the second conductive layer electroplated over the conductive seed layer.

In conclusion, major advantages of this invention at least includes:

1. The invention discloses that conductive layers are electroplated on both sides of a circuit substrate with forming only one conductive seed layer but without forming the conventional plating lines on the circuit substrate. Therefore, the routing space can be enlarged and the routing density can be enhanced.
2. The invention discloses that conductive layers are electroplated on both sides of a circuit substrate with forming only one conductive seed layer but without forming the conventional plating lines on the circuit substrate. Therefore, there is no stubs, generated by cutting the plating lines, remaining on the circuit substrate to interfere with signal transmission. Thus, the circuit substrate formed by using the method of the present invention has superior electrical properties.
3. The invention discloses that conductive layers are electroplated on both sides of a circuit substrate with forming only one conductive seed layer. Therefore, the method of the present invention has lower process time and cost than the conventional method requiring two conductive seed layers.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a circuit substrate, comprising the steps of:
   providing a circuit substrate having a first surface and a second surface, wherein the circuit substrate includes at least a first pad, at least a second pad, a first patterned solder mask layer and a second patterned solder mask layer, the first pad and the second pad are formed respectively on the first surface and on the second surface, the first pad is electrically connected to the second pad, the first patterned solder mask layer is formed on the first surface and has at least an opening exposing the first pad, and the second patterned solder mask layer is formed on the second surface and has at least an opening exposing the second pad;
   forming a conductive seed layer over the second surface;
   forming a patterned mask layer over the second surface, wherein the patterned mask layer has at least an opening exposing the conductive seed layer positioned over the second pad;
   electroplating a first conductive layer and a second conductive layer respectively over the first pad and over the second pad;
   eliminating the patterned mask layer; and
   patterning the conductive seed layer.

2. The method of claim 1, wherein the circuit substrate includes a patterned insulation layer formed on the first surface, the first patterned solder mask layer is formed on a surface of the insulation layer, and the surface of the insulation layer is coplanar with a surface of the first pad.

3. The method of claim 1, wherein the circuit substrate includes a patterned insulation layer formed on the second surface, the second patterned solder mask layer is formed on a surface of the insulation layer, and the surface of the insulation layer is coplanar with a surface of the second pad.

4. The method of claim 1, wherein the step of patterning the conductive seed layer is provided by etching or polishing.

5. A method for fabricating a circuit substrate, comprising the steps of:
   providing a circuit substrate having a first surface and a second surface, wherein the circuit substrate includes at least a first pad, at least a second pad, a first patterned solder mask layer and a second patterned solder mask layer, the first pad and the second pad are formed respectively on the first surface and on the second surface, the first pad is electrically connected to the second pad, the first patterned solder mask layer is formed on the first surface and has at least an opening exposing the first pad, and the second patterned solder mask layer is formed on the second surface and has at least an opening exposing the second pad;
   forming a conductive seed layer over the second surface;
   electroplating a first conductive layer and a second conductive layer respectively over the first pad and over the conductive seed layer;
   forming a patterned mask layer over the second surface, wherein the patterned mask layer covers the second conductive layer positioned over the second pad;
   patterning the second conductive layer;
   patterning the conductive seed layer; and
   eliminating the patterned mask layer.

6. The method of claim 5, wherein the circuit substrate includes a patterned insulation layer formed on the first surface, the first patterned solder mask layer is formed on a surface of the insulation layer, and the surface of the insulation layer is coplanar with a surface of the first pad.

7. The method of claim 5, wherein the circuit substrate includes a patterned insulation layer formed on the second surface, the second patterned solder mask layer is formed on a surface of the insulation layer, and the surface of the insulation layer is coplanar with a surface of the second pad.

8. The method of claim 5, wherein the step of patterning the conductive layer is provided by etching.

9. The method of claim 5, wherein the step of patterning the conductive seed layer is provided by etching or polishing.

10. A method for fabricating a circuit substrate, comprising the steps of:
- providing a circuit substrate having a first surface and a second surface, wherein the circuit substrate includes at least a first pad and at least a second pad, the first pad and the second pad are formed respectively on the first surface and on the second surface, and the first pad is electrically connected to the second pad;
- forming a conductive seed layer over the second surface;
- forming a first patterned mask layer and a second patterned mask layer respectively over the first surface and over the conductive seed layer, wherein the first patterned mask layer has at least an opening exposing the first pad, and the second patterned mask layer has at least an opening exposing the conductive seed layer positioned over the second pad;
- electroplating a first conductive layer and a second conductive layer respectively over the first pad and over the second pad;
- eliminating the first patterned mask layer and the second patterned mask layer; and
- patterning the conductive seed layer.

11. The method of claim 10 further comprising forming a patterned solder mask layer over the first surface and the patterned solder mask layer has at least an opening exposing the first conductive layer.

12. The method of claim 10 further comprising forming a patterned solder mask layer over the second surface and the patterned solder mask layer has at least an opening exposing the second conductive layer.

13. The method of claim 10, wherein the circuit substrate includes a patterned insulation layer formed on the first surface, the first patterned solder mask layer is formed on a surface of the insulation layer, and the surface of the insulation layer is coplanar with a surface of the first pad.

14. The method of claim 10, wherein the circuit substrate includes a patterned insulation layer formed on the second surface, the second patterned solder mask layer is formed on a surface of the insulation layer, and the surface of the insulation layer is coplanar with a surface of the second pad.

15. The method of claim 10, wherein the step of patterning the conductive seed layer is provided by etching or polishing.

16. A method for fabricating a circuit substrate, comprising the steps of:
- providing a circuit substrate having a first surface and a second surface, wherein the circuit substrate includes at least a first pad and at least a second pad, the first pad and the second pad are formed respectively on the first surface and on the second surface, and the first pad is electrically connected to the second pad;
- forming a conductive seed layer over the second surface;
- forming a first patterned mask layer over the first surface, wherein the first patterned mask layer has at least an opening exposing the first pad;
- electroplating a first conductive layer and a second conductive layer respectively over the first pad and over the conductive seed layer;
- forming a second patterned mask layer over the second conductive layer, wherein the second patterned mask layer covers the second conductive layer positioned over the second pad;
- patterning the second conductive layer;
- patterning the conductive seed layer; and
- eliminating the first patterned mask layer and the second patterned mask layer.

17. The method of claim 16 further comprising forming a patterned solder mask layer over the first surface and the patterned solder mask layer has at least an opening exposing the first conductive layer.

18. The method of claim 16 further comprising forming a patterned solder mask layer over the second surface and the patterned solder mask layer has at least an opening exposing the second conductive layer.

19. The method of claim 16, wherein the circuit substrate includes a patterned insulation layer formed on the first surface, the first patterned solder mask layer is formed on a surface of the insulation layer, and the surface of the insulation layer is coplanar with a surface of the first pad.

20. The method of claim 16, wherein the circuit substrate includes a patterned insulation layer formed on the second surface, the second patterned solder mask layer is formed on a surface of the insulation layer, and the surface of the insulation layer is coplanar with a surface of the second pad.

21. The method of claim 16, wherein the step of patterning the conductive seed layer is provided by etching or polishing.

22. A method for fabricating a circuit substrate, comprising the steps of:
- providing a circuit substrate having a first surface and a second surface, wherein the circuit substrate includes at least a first pad and at least a second pad, the first pad and the second pad are formed respectively on the first surface and on the second surface, and the first pad is electrically connected to the second pad;
- forming a conductive seed layer over the second surface;
- electroplating a first conductive layer and a second conductive layer respectively over the first pad and over the second pad; and
- patterning the conductive seed layer.

23. The method of claim 22, wherein the circuit substrate includes a patterned insulation layer formed on the first surface, the first patterned solder mask layer is formed on a surface of the insulation layer, and the surface of the insulation layer is coplanar with a surface of the first pad.

24. The method of claim 22, wherein the circuit substrate includes a patterned insulation layer formed on the second surface, the second patterned solder mask layer is formed on a surface of the insulation layer, and the surface of the insulation layer is coplanar with a surface of the second pad.

25. The method of claim 22, wherein the step of patterning the conductive seed layer is provided by etching or polishing.

* * * * *